United States Patent [19]

Davies

[11] Patent Number: 4,576,823
[45] Date of Patent: Mar. 18, 1986

[54] VACUUM SHEET

[76] Inventor: William A. Davies, P.O. Box 468, Richmond, Ontario, Canada, K0A 2Z0

[21] Appl. No.: 666,939

[22] Filed: Oct. 31, 1984

[51] Int. Cl.⁴ .................. B32B 3/14; G03B 27/60
[52] U.S. Cl. ........................ 428/61; 428/58; 355/91; 355/129; 355/132
[58] Field of Search .............. 428/61, 58, 57; 248/362, 363; 279/3; 269/21; 355/91, 129, 132, 92

[56] References Cited

U.S. PATENT DOCUMENTS 324,960  8/1885  Sack ............................. 355/91
3,420,608  1/1969  Canale ......................... 355/91

Primary Examiner—John E. Kittle
Assistant Examiner—Thomas C. Saitta
Attorney, Agent, or Firm—Sughrue, Mion, Zinn, Macpeak and Seas

[57] ABSTRACT

There is described an improved vacuum sheet for use in contact vacuum frames, the sheet including at least two planar sheets of material joined together to form a seam therebetween, and a third planar sheet of material applied to one side of said at least two sheets to be substantially centered over the seam formed therebetween.

17 Claims, 7 Drawing Figures

VACUUM SHEET

BACKGROUND OF THE INVENTION

The present invention relates to an apparatus for improving the efficiency of contact printing vacuum frames and more particularly to a vacuum sheet for use in vacuum frames which reduces the time required to complete vacuum distribution between the blanket and glass portions of the vacuum frame.

The use of contact vacuum frames in the production of film positives and negatives, lithographic plates, peal coats, scribes and colour proofs is of course well known and there are a number of well established manufacturers in the field producing contact vacuum frames of various sizes ranging from a few feet on each side to dimensions of up to 15 feet by 5 feet.

Generally speaking, the purpose of a vacuum frame is to ensure the closest possible contact between original material to be reproduced onto film and the film itself without any intervening air pockets (also called hot spots) between either the original material and the film or between these sandwiched materials and the vacuum frame glass.

The materials to be reproduced are placed between the glass and blanket portions of the frame which are brought together and sealed. A vacuum is then applied to the space between the blanket and the glass to force the sandwiched materials together and against the vacuum frame glass. Typically, negative or vacuum pressures of approximately 25 psi are required with the air being drawn from air outlets provided at the extremes of the frame such as at the ends or corners of the blanket.

A primary drawback of vacuum frames is the length of time required to make a good "contact", that is, the time required for the complete and even distribution of vacuum within the frame to eliminate hot spots. This typically requires anywhere from 10 to 30 minutes or more, depending upon the size of the frame and the number of layers of material sandwiched together, which may be quite a few particularly when preparing colour proofs. This waiting or "vacuum" time is essentially non-productive down time.

After the prolonged waiting period, printers will look for physical indicia of a good contact such as an even distribution of Newton's Rings, an oily looking pattern of squiggles, between the top film and the contact frame glass. The appearance of Newton's rings is not however an infallible guide to a good contact with the result that printers will allow for additional vacuum time due to the mistrust factor, which again reduces the efficiency of these machines.

Other problems also occur particularly in respect of a shift in the sandwiched materials when the frame is closed causing poor registration and improper alignment of the films.

SUMMARY OF THE INVENTION

It has been found that the use of a vacuum sheet as will hereinafter be discussed in greater detail significantly reduces the vacuum time required to complete a good contact.

Generally speaking, the vacuum sheet of the present invention will provide a seamed platform on which the sandwiched materials will be positioned and which includes therein at least one seam to allow the relatively rapid evacuation of air from the vicinity of the materials. The vacuum sheet will have the further effect of applying greater pressure to the sandwiched materials against the contact frame glass.

Accordingly, it is an object of the present invention to obviate and mitigate from the disadvantages of vacuum frames generally.

A further object of the present invention is to provide a vacuum sheet having at least one seam formed therein to facilitate rapid creation of an evenly distributed vacuum within a closed contact vacuum frame.

According to the present invention, then, there is provided a sheet for use in a contact vacuum frame to improve vacuum times, comprising at least two planar sheets of material butt-jointed together to form a seam therebetween and a third planar sheet of material applied to one side of the at least two sheets to be substantially centered over the seam formed therebetween.

DESCRIPTION OF THE DRAWINGS

Embodiments of the invention will now be described in greater detail and will be better understood when read in conjunction with the following drawings in which.

DESCRIPTION OF THE PREFERRED EMBODIMENTS

Figure 1:
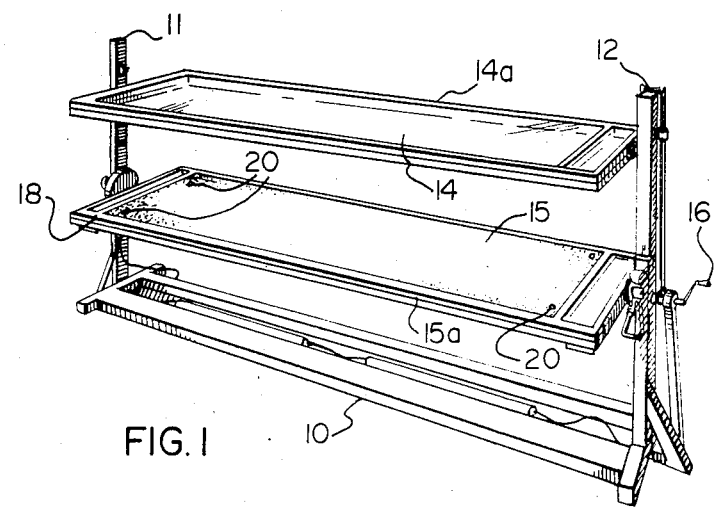
FIG. 1 is a perspective view of a known vacuum frame of typical construction.

With reference to FIG. 1, a vacuum frame of a known sort is shown comprising generally a base 10, upright end supports 11 and 12, a contact frame glass 14 and a blanket 15, each supported by a respective frame 14a and 15a. The glass is vertically movably supported on end supports 11 and 12 and may be moved into contact with the blanket by means of a crank 16. Rubber gaskets 18 provided about the peripheries of frames 14a and 15a provide an airtight seal between the two frames when closed. A pump (not shown), capable of exerting approximately 25 pounds of vacuum pressure draws air from between the glass and the blanket through valves 20 provided at the ends or at the corners of the blanket.

The films which make up the sandwiched materials and which in a simple situation might consist of an ink tracing and a correspondingly sized piece of film onto which the tracing is developed, are initially placed onto the blanket. The glass is then contacted to the blanket and the air therebetween is evacuated. The occurrence of Newton's rings in an evenly distributed pattern over the films will generally indicate the formation of a good contact and the film will then be exposed using a light source conveniently located above the glass.

The amount of time required to obtain a good contact will vary with the size of the frame, the number of sandwiched layers and the types of films and screens being used and will seldom be less than 10 minutes and often more than 20 or 30 minutes.

Figure 2:
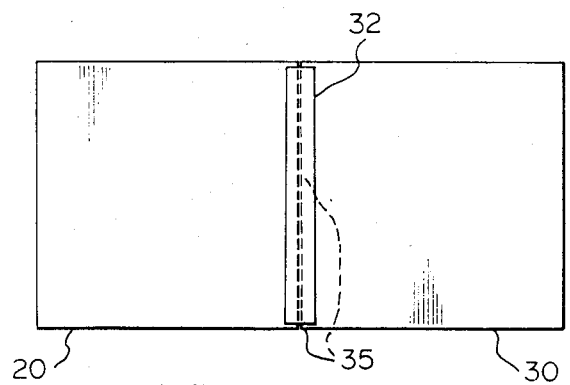
FIGS. 2 and 2a are a bottom plan view of a vacuum sheet including two planar sheets of material joined together to form a seam therebetween.
Figure 2A:
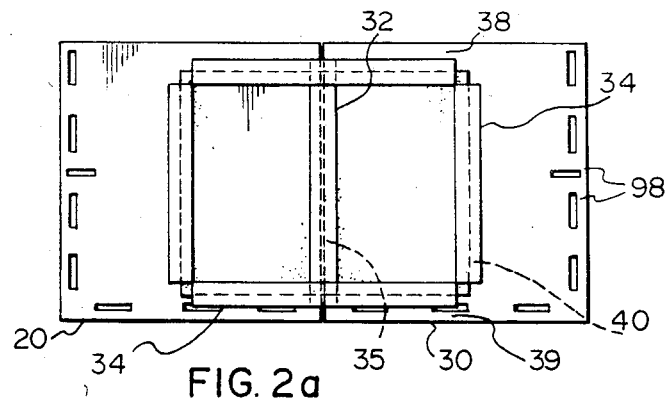

With reference to FIGS. 2 and 2a, there is shown a vacuum sheet consisting of two planar sheets 20 and 30 of a generally board-like material such as high quality art board of the sort readily available at most art supply outlets. The art board is approximately 1/16 inches in thickness and may be of the variety that has a black sheen finish on one side and a flat white finish on the other. The black sheen finish offers less friction and therefore is advantageously the side that will be contacted to the sandwiched films.

The size of sheets 20 and 30 will depend on the size of the vacuum frame and the size format of most jobs done on that frame and will vary in size ranging from several feet on each side to perhaps a foot or less.

As shown, the two sheets are rectangular in outline viewed from the top or bottom. Other shapes may be utilized if desired although it is preferable that the edges joined together form a straight seam.

The two sheets of art board 20 and 30 are butt-jointed together as carefully as possible, being in edge abutment with an open seam therebetween, and connected by means such as a strong piece of three inch wide bookbinding tape 32. Other means of connecting the two sheets will occur to those skilled in the art but the important aspect of course is the formation of the seam 35 between the two sheets.

As thusly described, the vacuum sheet so formed may be used on the vacuum frame but to provide greater rigidity and to improve performance, a third backing or reinforcing sheet 40 is centered over seam 35 and is taped to sheets 20 and 30 using strips of tape 34. Prior to taping, sheet 40, if the same size as sheets 20 and 30, is cut back an inch or two to provide spacings 38 and 39 between the upper and lower edges thereof and the adjacent corresponding edges of sheets 20 and 30.

It is preferable that the tape securing sheet 40 in place not overlap at the corners of the sheet so that air can escape more quickly.

In place of tape, sheet 40 may be connected to sheets 20 and 30 by means of, for example, drops of glue randomly distributed between the sheets. A solid layer of glue between the sheets should be avoided as this will tend to inhibit the outward flow of air. When using glue in this fashion, care should be taken to avoid placing the glue where it could flow into seam 35 and inhibit or stop the flow of air.

The vacuum sheet as thusly described is placed on the vacuum frame with backing sheet 40 towards the blanket. As the vacuum sheet is thicker towards its center and slopes or falls off towards its outer edges, greater pressure is applied to films centered thereon when contacted by the glass. If it is desired to increase this pressure, additional backing sheets can be added in superimposed layers to backing sheet 40. Particularly in older, larger vacuum frames, the glass has a tendency to permanently wow or warp towards the centre, creating the potential for distortion of the image. By building up the vacuum sheet using additional backing sheets, sufficient additional pressure can be generated on the glass when contacted to the film to counteract the warp during exposure, eliminating, at least temporarily, the expense of replacing the glass.

Figure 3:
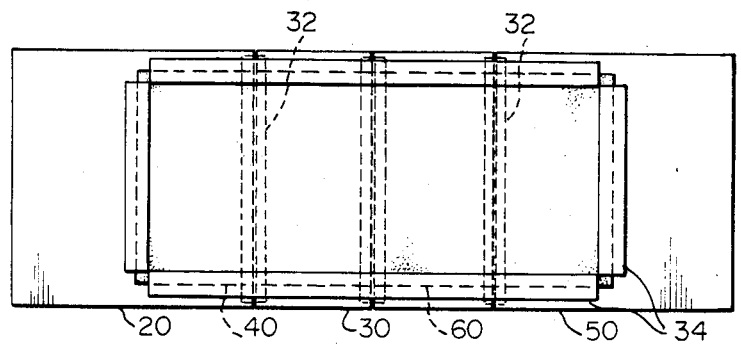
FIG. 3 is a plan view of a modified vacuum sheet.
Figure 4:
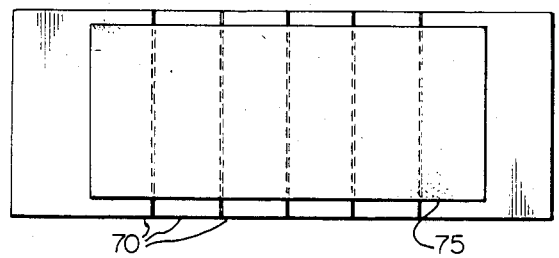
FIG. 4 is a plan view of a further modified vacuum sheet.

If a contact sheet of greater length is required, an additional sheet of art board 50 is butt-jointed to one of sheets 20 or 30 as shown in FIG. 3 together with an additional backing sheet 60. This pattern may be repeated as frequently as required.

Where it is desirable to form a vacuum sheet including a relatively large number of seams, strips of art board 70 may be taped together as shown in FIG. 4 with one or more backing sheets 75 taped or glued thereto. Strips 70 may be of equal or, as shown, of differing widths.

Figure 5:
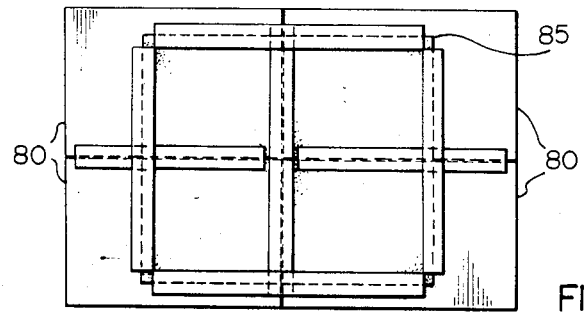
FIG. 5 is a plan view of a further modified vacuum sheet.

As will be appreciated, a number of different seam patterns are possible. By way of example, there is shown in FIG. 5 a crossing pattern of seams formed by taping together at least four sheets of board 80 together with a suitably sized backing sheet 85.

Figure 6:
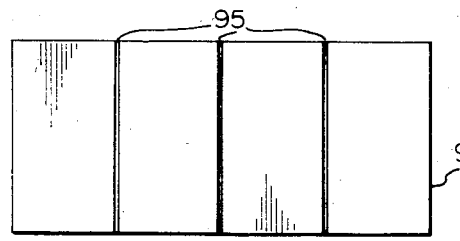
FIG. 6 is a plan view of yet another modified vacuum sheet.
Figure 7:
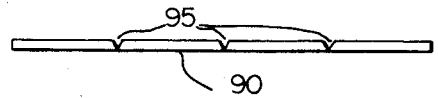
FIG. 7 is a side elevational view of the modified vacuum sheet of FIG. 6.

Yet another embodiment is shown in FIGS. 6 and 7 wherein a single planar sheet of material such as a sheet of plastic 90 is used. The plastic is incised at one or more locations 95 as seen most clearly from the side view of FIG. 7 to form the required seams. Sheets of plastic may also be used in accordance with the embodiments of Figures 2 to 5 particularly where the vacuum frames on which the sheets are used are located in dust-free "clean rooms".

Use of materials other than plastic and art board is contemplated but art board in particular, being readily inexpensive and easy to work with, is a preferred commodity.

For purposes of precise film registration when performing multiple exposures, the present vacuum sheet can be punched in any required pattern to form the holes through which the registration pins pass upwardly. An exemplary registration pattern consisting of variously aligned rectangular apertures 98 formed along the peripheries of sheets 20 and 30 is shown in FIG. 2a. Other patterns are obviously possible to conform with any registration pin system.

The vacuum sheets described herein are easy and relatively inexpensive to make. Accordingly, for each vacuum frame, a number of sheets of different sizes can be made and kept on hand for use as required depending upon job size and format.

In use, the vacuum sheets are placed on the frame with the backing sheet towards the blanket. In blanket-down frames, the vacuum sheet is placed on the blanket and the sandwiched materials are placed on the vacuum sheet. The glass is contacted to the blanket and the air trapped therebetween is evacuated. The layered shape of the vacuum sheet applies extra pressure to the films against the glass and the seam or seams therein facilitate the outward flow of air to significantly reduce the vacuum times required to form a good contact. Because the vacuum sheet itself is drawn towards the contact frame glass, the fall-off or slope of sheets 20 and 30 beyond the backing sheet 40 has no effect whatsoever on the exposure.

Some contact frames are arranged with the glass down and the blanket up, in which case the films are placed directly on the glass and the vacuum sheet is placed over the films, once again with backing sheet 40 towards the blanket.

Use of the blanket sheets as aforesaid has been found to provide not only improved vacuum times, but also better film registration, reduced slippage of masking, reduction in the number of makeovers and the reduction or elimination of flash fogging due to static electricity.

The above described specific embodiments of the invention have been set forth for the purposes of illustration. It will be apparent to those skilled in the art that various modifications may be made in the structure of the sheets without departing from the principles of this invention as it is pointed out and disclosed herein. For that reason, it is not intended that the invention should be limited other than by the scope of the appended claims.

I claim:

1. A vacuum sheet for use in a contact vacuum frame to improve vacuum times, comprising:
   at least two substantially planar sheets of material jointed together to form at least a partially open seam therebetween, said seam facilitating the evacuation of air from the vicinity of the vacuum sheet; and
   a third planar sheet of material applied to one side of said at least two sheets to reinforce the same and to cover at least a portion of said seam formed therebetween.

2. The vacuum sheet as claimed in claim 1 wherein said third sheet covers a central portion of said seam.

3. The vacuum sheet as claimed in claim 2, wherein said first and second sheets are in edge abutment defining an open seam therebetween and are connected together by means of strong adhesive tape overlying said open seam, and said third sheet is connected to said at least two sheets by means of strong adhesive tape applied at each edge of said third sheet without overlap of said type at the corners of said third sheet.

4. The vacuum sheet as claimed in claim 3, wherein each of said two planar sheets is rectangular in shape.

5. In a vacuum frame including a blanket and a contact frame glass adapted to form an airtight seal therebetween, and means to apply vacuum pressure between said blanket and glass for contact printing purposes, the improvement comprising a vacuum sheet disposed between said blanket and glass to reduce vacuum times, said sheet comprising:
   at least two substantially planar sheets of material placed together to define at least a partially open seam therebetween, said seam facilitating the evacuation of air from the vicinity of said vacuum sheet; and
   a third planar sheet of material applied to one side of said at least two sheets to be disposed about said seam formed therebetween, whereby said third sheet of material is provided between said blanket and said at least two sheets of material.

6. The vacuum frame as claimed in claim 5, wherein said third sheet covers only a portion of said seam.

7. The vacuum frame according to claim 6, wherein said portion is a central portion of said seam.

8. The vacuum frame according to claim 7, wherein said at least two planar sheets of material are in edge abutment defining an open seam therebetween and are connected together by means of strong adhesive tape overlying said open seam, and said third sheet is connected to said at least two sheets by means of strong adhesive tape applied at each edge of said third sheet without overlap of said tape at the corners of said third sheet.

9. The vacuum frame as claimed in claim 8, wherein each of said at least two sheets and said third sheet of material is rectangular in shape and consists of one of either high quality artboard and plastic.

10. A method of improving vacuum times in a vacuum frame having a blanket and a contact frame glass adapted to contact one another to form an airtight seal therebetween, and means to apply vacuum pressure between said blanket and glass for contact printing of films placed therebetween, said method comprising the steps of:
    forming at least one, at least partially, open seam in a substantially planar sheet of material;
    aligning said at least one seam between said blanket and said films; and
    applying said vacuum pressure to said vacuum frame, whereby said at least one seam facilitates the evacuation of air from the vicinity of said films to reduce said vacuum time required to properly contact said films in said vacuum frame.

11. The method as claimed in claim 10, wherein said at least one seam is formed by placing at least two substantially planar sheets of material in edge abutment to define an open seam therebetween.

12. The method as claimed in claim 11, further comprising the step of applying a third planar sheet of material to one side of said at least two substantially planar sheets so that the third sheet is disposed about at least a portion of said seam and reinforces said at least two sheets of material, said third sheet being disposed between said blanket and said at least two substantially planar sheets.

13. The method as claimed in claim 12, wherein said at least two substantially planar sheets of material are joined together by means of strong adhesive tape and said third sheet is connected to said at least two sheets by means of strong adhesive tape applied at each edge of said third sheet without overlap of said tape at the corners of said sheet.

14. The method as claimed in claim 11, wherein said at least one seam is formed by making an incision in said planar sheet of material between opposite edges thereof.

15. The method as claimed in claim 14, wherein said substantially planar sheet of material consists of one of plastic and high quality artboard.

16. The method as claimed in claim 13, wherein said at least two sheets and said third planar sheet of material consists of one of high quality artboard and plastic.

17. In a vacuum frame including a blanket and a contact frame glass adapted to form an airtight seal therebetween, and means for applying vacuum pressure between said blanket and glass for contact printing of films placed therebetween, the improvement comprising a vacuum sheet disposed between said blanket and glass to reduce vacuum times, said sheet comprising:
    a substantially planar sheet of material having at least one at least partially open seam formed therein to extend between opposite edge portions of said planar sheet of material, said planar sheet of material being disposed between said blanket and said films with said at least one seam disposed adjacent said films, said at least one seam facilitating the evacuation of air from the vicinity of said vacuum sheet.

* * * * *